(12) United States Patent
Müller et al.

(10) Patent No.: US 7,767,528 B2
(45) Date of Patent: Aug. 3, 2010

(54) FIELD EFFECT TRANSISTOR AND FABRICATION METHOD

(75) Inventors: Karlheinz Müller, Velden (DE); Klaus Röschlau, Grafing (DE)

(73) Assignee: Infineon Technologies AG, Munich (DE)

( * ) Notice: Subject to any disclaimer, the term of this patent is extended or adjusted under 35 U.S.C. 154(b) by 92 days.

(21) Appl. No.: 11/295,152

(22) Filed: Dec. 6, 2005

(65) Prior Publication Data

US 2006/0125000 A1 Jun. 15, 2006

Related U.S. Application Data

(63) Continuation of application No. PCT/EP2004/050802, filed on May 13, 2004.

(30) Foreign Application Priority Data

Jun. 12, 2003 (DE) .............................. 103 26 523

(51) Int. Cl.
*H01L 21/336* (2006.01)
(52) U.S. Cl. ....................... 438/270; 257/343
(58) Field of Classification Search ................ 257/329, 257/330, 331, 335, E21.417; 438/270
See application file for complete search history.

(56) References Cited

U.S. PATENT DOCUMENTS

| | | | | |
|---|---|---|---|---|
| 4,929,988 A | * | 5/1990 | Yoshikawa | ................... 257/316 |
| 5,349,224 A | * | 9/1994 | Gilbert et al. | ................ 257/333 |
| 5,701,026 A | * | 12/1997 | Fujishima et al. | ........... 257/510 |
| 5,723,891 A | | 3/1998 | Malhi | |
| 6,221,721 B1 | * | 4/2001 | Takahashi | .................... 438/270 |
| 6,432,775 B2 | * | 8/2002 | Blanchard | .................... 438/270 |
| 6,855,986 B2 | * | 2/2005 | Hsieh et al. | .................. 257/339 |
| 6,958,513 B2 | * | 10/2005 | Wang | .......................... 257/330 |
| 2002/0125527 A1 | * | 9/2002 | Blanchard | .................... 257/328 |

FOREIGN PATENT DOCUMENTS

| | | |
|---|---|---|
| DE | 102 23 822 A1 | 5/2002 |
| JP | 06021467 A * | 1/1994 |
| JP | 06104446 | 5/1994 |
| JP | 02249276 | 10/1994 |

OTHER PUBLICATIONS

Naoto Fujishima and C. Andre T. Salama, *A Trench Lateral Power Mosfet Using Self-Aligned Trench Bottom Contact Holes*, pp. 14.3.1-14.3.4, IEEE 1997.

(Continued)

*Primary Examiner*—N Drew Richards
*Assistant Examiner*—Grant S Withers
(74) *Attorney, Agent, or Firm*—Brinks Hofer Gilson & Lione

(57) ABSTRACT

A field effect transistor (FET) and fabrication method are disclosed. The FET includes a drift region formed in a substrate. A trench adjoins the drift region and contains at least one control region and a connection region. An inversion channel region is isolated from the control region. A portion of the trench extends to the same depth as a second trench that insulates the FET from other components formed in the substrate. Insulating material is disposed between the trench below the control region and the control region. An insulating layer insulates the FET from the substrate. The trench and/or the connection region may extend into the insulating layer or may be isolated from the insulating layer via the drift region.

8 Claims, 4 Drawing Sheets

OTHER PUBLICATIONS

International Search Report from corresponding International Application No. PCT/EP2004/050802.

International Preliminary Examination Report from corresponding International Application No. PCT/EP2004/050802.

* cited by examiner

FIELD EFFECT TRANSISTOR AND FABRICATION METHOD

PRIORITY CLAIM

This application is a continuation of international application PCT/EP2004/050802, filed on May 13, 2004, which claims the benefit of priority to German Application DE 103 26 523.6 filed on Jun. 12, 2003, both of which are incorporated by reference in their entirety.

TECHNICAL FIELD

The present embodiments relate to a field effect transistor and fabrication method. More particularly, the embodiments relate to a double diffused metal oxide semiconductor transistor and associated fabrication method.

BACKGROUND

The vast majority of electronic devices employ integrated circuits. However, many integrated circuit arrangements are complicated, use a substantial amount of valuable real estate on the semiconductor wafer on which they are fabricated, and are limited in integration, particularly when including field effect transistors which switch currents or voltages of widely varying amounts. In addition, many integrated circuit arrangements are difficult to fabricate, using multiple exacting process steps that are costly in terms of processing material usage and time. As the number and complexity of process steps increases, the ultimate yield of the integrated circuit arrangement decreases, thereby driving up costs to the manufacturer and ultimately the consumer.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which.

Skilled artisans appreciate that elements in the figures are illustrated for simplicity and clarity and have not necessarily been drawn to scale.

DETAILED DESCRIPTION

A field effect transistor and fabrication method thereof is described in which a control region and connection region are arranged in one trench. Insulating material of the trench serves for setting the length of a drift path in the transistor. Long insulating regions can be produced, which result in a high dielectric strength without additional chip area being used. The field effect transistor thus has a low on resistivity $R_{ON}$ and a high saturation current $I_{SAT}$, while decreasing the fabrication steps and increasing the degrees of freedom for realization of different electronic properties of the field effect transistor.

Figure 1:
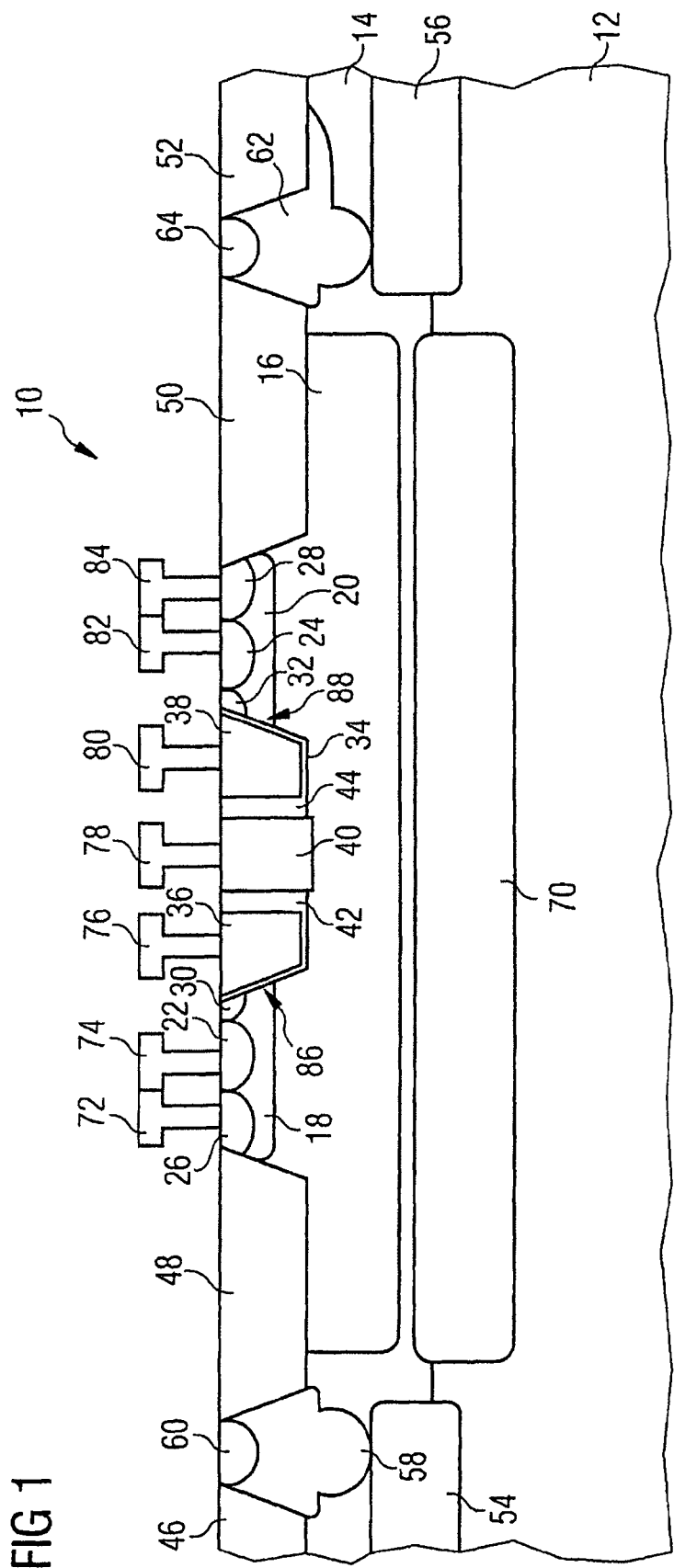
FIG. 1 shows a DMOS transistor with a shallow insulating trench.

FIG. 1 shows a DMOS transistor 10, which is part of an integrated circuit. The integrated circuit is constructed on a substrate 12, which is composed, for example, of lightly p-doped silicon. An n-doped epitaxial layer 14 is situated on the substrate surface of the substrate 12. The n-doped epitaxial layer 14 has a thickness of greater than 1.5 μm or greater than 2.0 μm, for example.

A number of different doped portions are formed in the n-type epitaxial layer 14. These regions include, with increasing distance from the substrate 12, an n-doped well 16, p-doped channel forming zones 18, 20, and doped areas at the surface of the epitaxial layer 14. As shown in FIG. 1, the doped areas at the surface of the epitaxial layer 14 include heavily n-doped source connection regions 22, 24, heavily p-doped connection regions 26, 28 for the channel connection zone 18 and 20, respectively, and lightly n-doped lengthening regions 30, 32 of the source connection region 22 and 24, respectively. The lengthening regions 30, 32, for example, may be omitted.

The central part of transistor 10 contains a shallow trench 34. Two heavily n-doped gate regions 36, 38 are arranged in edge regions of the shallow trench 34 and a heavily n-doped drain region 40 is arranged in the central part of the shallow trench 34. The trench may be free of monocrystalline semiconductor material. The trench can instead be filled with polycrystalline semiconductor material or with an electrically insulating material.

The drain region 40 is isolated from the gate region 36 by an insulation region 42 and from the gate region 38 by an insulation region 44. The insulation regions 42 and 44 are likewise situated in the trench 34. A thin insulation layer is situated on the trench walls and on the trench bottom below the gate regions 36 and 38 of the trench 34, and insulates the gate regions 36, 38 from the n-type well 16 and, respectively, from the channel forming zone 18, 20 and from the lengthening regions 30 and 32, respectively. By way of example, silicon dioxide or some other material is suitable as the insulating material.

Figure 4:
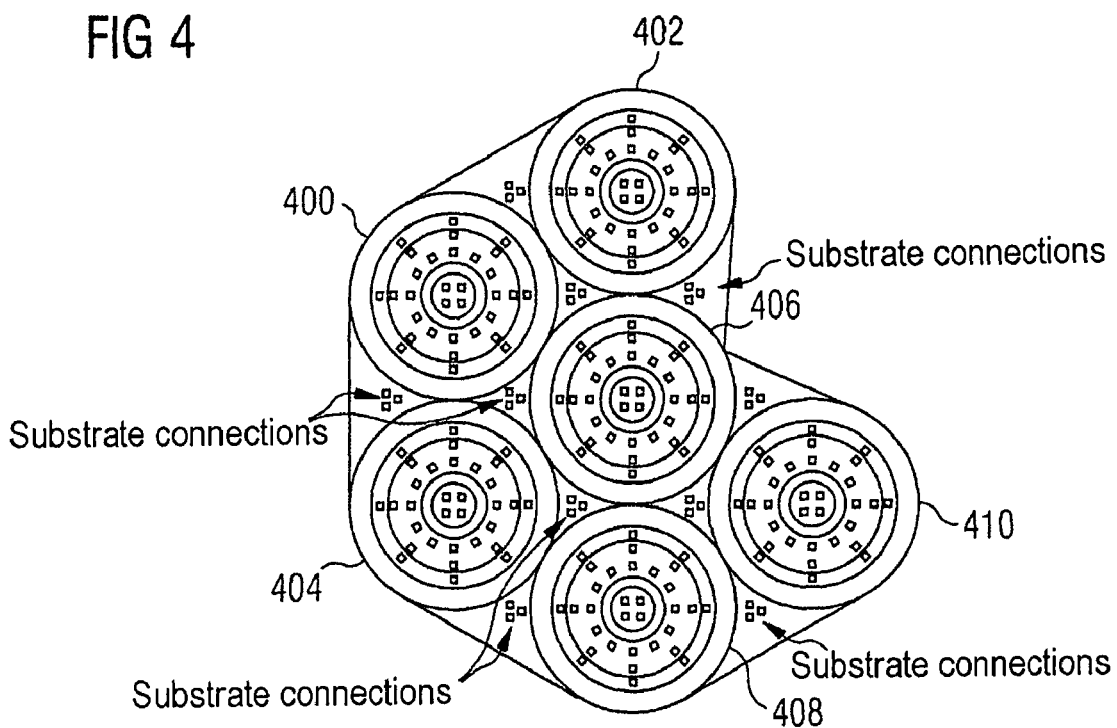
FIG. 4 shows ring-shaped DMOS transistors.

Further insulation trenches 46 to 52 are formed together with the trench 34. Each of the insulation trenches 46 to 52 have the same depth, 0.5 μm for example. The transistor 10 is electrically insulated from other components of the integrated circuit arrangement by the two adjoining insulating trenches 48 and 50 and also insulating wells discussed below. In one exemplary embodiment, the two insulation trenches 48 and 50 are also regions of a ring-shaped insulation trench, as shown in FIG. 4.

In FIG. 1, the body connection region 26, the source connection region 22 and the lengthening region 30 are situated between the insulating trench 48 and the trench 34. The lengthening region 32, the source connection region 24 and the body connection region 28 are situated between the insulation trenches 34 and 50.

Alongside the field effect transistor 10, the integrated circuit arrangement also contains npn and pnp bipolar transistors, for example to the right and left of the field effect transistor 10. To the left of the transistor 10, a p-doped buried layer 54 is situated in regions of the substrate 12 and the regions of the epitaxial layer 14. The buried layer 54 insulates the bipolar transistor on the left side of field effect transistor 10. On the right-hand side of the transistor 10, a buried layer 56 is situated at the same level as the buried layer 54. The buried layer 56 insulates the bipolar transistor on the right side of field effect transistor 10. The buried layer 54 is connected via a p-doped connection region 58 and a heavily p-doped connection region 60 at the surface of the epitaxial layer 14. The buried layer 56 is connected via a p-doped connection region 62 and via a heavily p-doped connection region 64 at the surface of the epitaxial layer 14. The connection region 60 lies between the insulation trenches 46 and 48. By contrast, the connection region 64 lies between the insulation trenches 50 and 52.

Situated below the field effect transistor 10 is a heavily n-doped buried layer 70, a small part of which is situated in the epitaxial layer 14 and a large part of which is situated in the p-doped substrate 12. The buried layer 70 serves for insulating the transistor 10 from the substrate 12. In other embodiments, the buried layer 70 may not be present.

The transistor 10 can be realized without an epitaxial layer 14, e.g. in a process in which exclusively CMOS transistors are to be fabricated. The n-type well 16 then extends in a p-doped substrate 12 or a p-type well in a n-type substrate.

In addition, several metallic connections are illustrated in FIG. 1. These metallic connections include: a left-hand body connection 72, a left-hand source connection 74, a left-hand gate connection 76, a drain connection 78, a right-hand gate connection 80, a right-hand source connection 82, and a right-hand body connection 74. The left-hand body connection 72 leads to the body connection region 26. The left-hand source connection 74 leads to the source region 22. The left-hand gate connection 76 leads to the gate region 36. The drain connection 78 is electrically conductively connected to the drain region 40. The right-hand gate connection 80 is connected to the gate region 38. The right-hand source connection 82 is connected to the source region 24. The right-hand body connection 74 is connected to the connection region 28.

As illustrated in FIG. 1, the left-hand body connection 72 and the left-hand source connection 74 are conductively connected to one another. Moreover, the right-hand source connection 82 and the right-hand body connection 84 are conductively connected to one another. Usually, the left-hand source connection 74 is also electrically conductively connected to the right-hand source connection 82. Likewise, the left-hand gate connection 76 and the right-hand gate connection 80 may be electrically conductively connected to one another. In another embodiment, the two gate connections are driven separately from one another and are thus not connected. The same can be realized for the two source connections.

The drain region 40 penetrates through the trench 34 and ends in the n-type well 16, so that, during operation of the transistor 10, a drift path forms from the lower bottom of the drain region 40 in the direction of a left-hand channel region 86 and a further drift path forms from the bottom of the drain region 40 in the direction of a right-hand channel region 88. The formation of the channel region is controlled by the voltage present at the gate connections 76 and 80, respectively.

In another embodiment, there is no electrically conductive connection between the body connections 72, 84 and the source connections 74, 82 if the arising of parasitic npn transistors is prevented by other measures. The doping of the n-type well 16 depends on the dielectric strength for the transistor 10.

Figure 2:
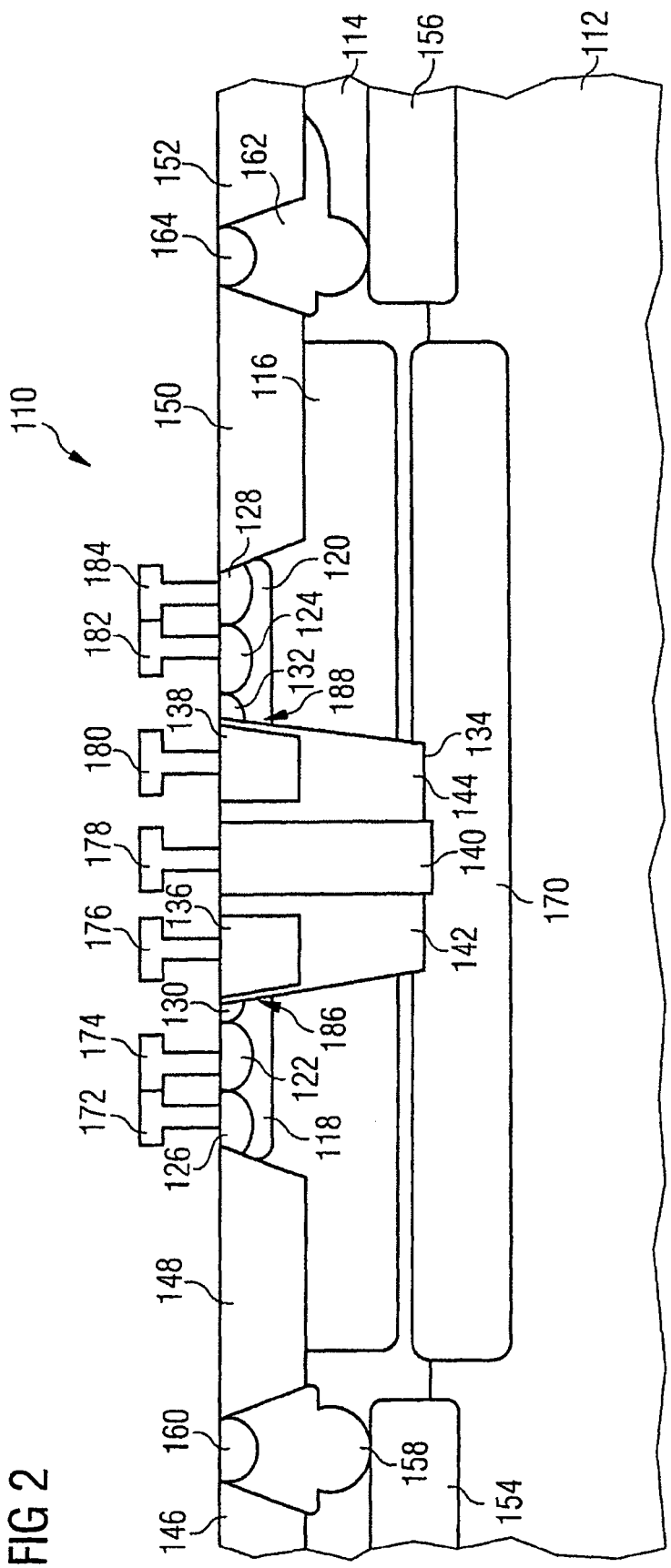
FIG. 2 shows a DMOS transistor with a deep insulating trench.

FIG. 2 shows a DMOS field effect transistor 110, which has been constructed and produced similar to the field effect transistor 10. Accordingly, elements which have already been explained above with reference to FIG. 1 will not be explained again. These elements have the same reference symbol in FIG. 2, but are preceded by a 1. Thus, an n-type well 116 of the transistor 110 corresponds to the n-type well 16 of the transistor 10.

In the case of the transistor 110, the trench 134 extends into the buried layer 170. In the case of the embodiment illustrated with reference to FIG. 2, the trench 134 is a deep insulating trench having a depth of greater than 1 micrometer, e.g. having a depth of 1.2 micrometers. In another embodiment, by contrast, the trench 134 is a shallow insulation trench.

The gate regions 136 and 138 extend only in the upper part of the trench 134, for example to a depth of 0.5 micrometer from the surface of the n-type epitaxial layer 114. The region below the gate region 136 as far as the trench bottom is filled by the insulating material of the insulating region 142, which also insulates the gate regions 136 from the drain region 140. The region below the gate region 138 as far as the trench bottom is filled in the same way by the insulating material of the insulating region 144, which also insulates the gate region 138 from the drain region 140. The drain region 140 penetrates through the trench bottom of the trench 134 and ends in the buried layer 170.

For the transistor 110 illustrated in FIG. 2, the drift path in the n-type well 116 is lengthened on account of the greater depth of the trench 134 in comparison with the depth of the trench 34 even though it does not have a part lying below the trench bottom. This permits higher drain-source voltages to be present. In addition, the drift current additionally flows along a linear path. This reduces the probability of field spikes occurring at curvatures along the path.

In another embodiment, the transistor 110 is formed without an epitaxial layer 114, so that the n-type well 116 extends in the substrate 112. In an embodiment with or without an epitaxial layer 114, the buried layer 170 may be absent.

Figure 3:
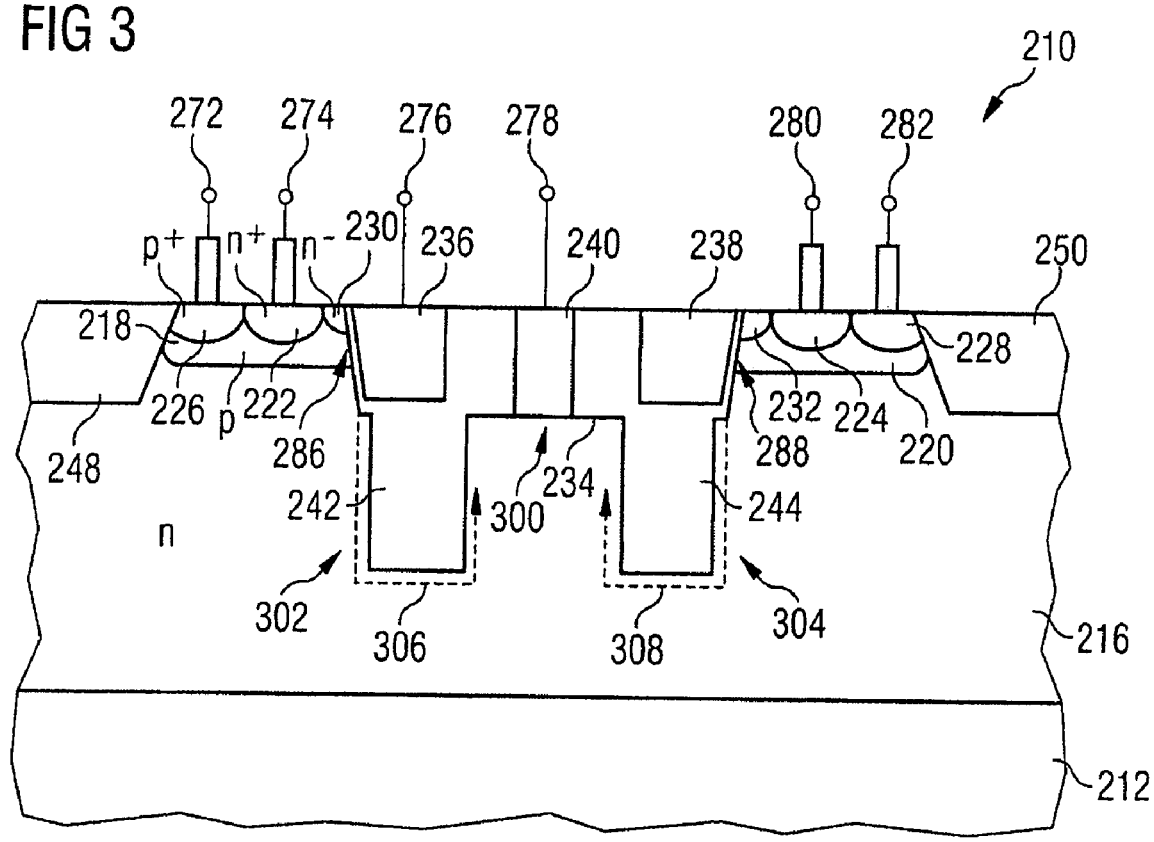
FIG. 3 shows a DMOS transistor with an insulating trench of varying trench depth.

FIG. 3 shows a DMOS field effect transistor 210, which is similar to the field effect transistor 10. Accordingly, elements which have already been explained above with reference to FIG. 1 will not be explained again. These elements have the same reference symbol in FIG. 3, but are preceded by a 2. Thus, an n-type well 216 of the transistor 210 corresponds to the n-type well 16 of the transistor 10.

In contrast to the transistor 10, the n-type well 216 is situated in a substrate 212 rather than in an epitaxial layer 14. Similarly, FIG. 3 lacks the buried layers 54 and 56 and also the connection regions 58, 60 and 62, 64 for the connection of these buried layers 54 and 56 fabricated in the transistor 10 of FIG. 1.

The central trench 234 of the transistor 210 has a middle shallow trench region 300 and two outer deep trench regions 302 and 304 below the gate regions 236 and 238. The deep trench regions 242 and 244 are electrically insulating and accommodate the lower parts of the insulating regions 242 and 244. The deep trench regions 242 and 244 extend for example to a depth of 6 μm (micrometers) or even to a depth of 20 μm. The drain connection region 240 is situated in the shallow trench part of the trench 234 and ends deeper than the shallow trench region 300 in the n-type well 216, for example more than 100 nm or more than 200 nm deeper, e.g. 500 nm deeper. On account of the deep trench regions 302 and 304, the lengths of drift paths 306 and 308 become approximately twice as long as the depth of the deep trench regions 242 and 244. For deep trench regions having a depth of 5 μm, the drift paths 306 and 308, respectively, are for example more than 10 μm long. These long drift paths can be obtained without using additional chip area in the lateral direction.

The transistor 210 can also be embodied with a heavily n-doped buried insulating layer. In another embodiment, the deep trench regions 302 and 304 do not reach as far as the insulating layer, however. The use of an epitaxial layer is also possible.

FIG. 4 shows ring-shaped DMOS transistors 400 to 410, which are all constructed like the transistors 10, 110 and/or 210. The transistors 400 to 410 are connected in parallel, so that currents up to 3 A (amperes), for example, can be switched if 50 or 100 transistors 400 to 410 are connected in parallel. Such currents are used for example in control circuits for driving hard disks in computers. The area used for the arrangement illustrated in FIG. 4 is very small.

Figure 5:
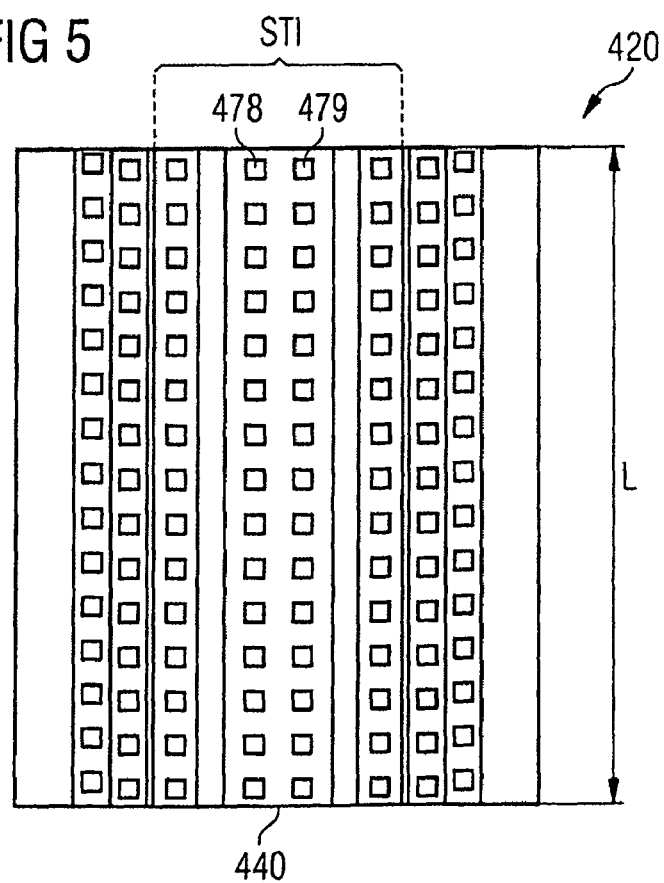
FIG. 5 shows a strip-type DMOS transistor.

FIG. 5 shows a strip-type DMOS transistor 420, which is constructed like the transistor 10, but there are two rows of drain connections 478, 479 above the drain region 440. A length L of the transistor 420 can be chosen freely depending on the current to be switched. Moreover, it is again possible for a plurality of strip-type transistors 420 to be connected in parallel with one another. The strip-type transistors 420 are suitable in particular when the metallization of the drain connections 478, 479 only permits a limited current flow.

Alternatively, the variants explained with reference to FIG. 4 may be embodied with hexagonal, i.e. with honeycomb-shaped, transistors.

Turning to fabrication of the transistor 10, the n-type well 16 is produced in an epitaxial layer 14 grown on the substrate 12. Using photolithographic techniques and using hard masks, the trench 34 and the insulation trenches 46 to 52 are etched and subsequently filled with silicon dioxide. The silicon dioxide is then planarized, for example using a CMP process (chemical mechanical polishing), i.e. as in the case of a conventional STI process (shallow trench insulation).

Next, regions for the gate regions 36 and 38 and for the drain region 40 are defined using photolithography. Afterward, the silicon dioxide is etched in these regions, stopping on the silicon of the n-type well 16. A thin dielectric is then produced on trench wall regions and on the uncovered bottom region of the trench 34. The thin dielectric may be formed using thermal oxidation, for example.

The cutout for the drain region 78 is fabricated using photolithography. Afterward, the thin insulation layer is removed at the bottom of the cutout for the drain region 78, for example using reactive ion or wet-chemical etching. Polycrystalline silicon is deposited in the cutouts for the gate regions 36, 38 and for the drain region 40. The polycrystalline silicon is doped in situ or using a subsequent diffusion or implantation. The heavily n-doped polycrystalline silicon is then planarized, for example using CMP. If appropriate, the polycrystalline silicon can also be removed outside the trench 34 by means of photolithography.

The position of the body regions 18, 20 is now defined using photolithography. The body regions are then p-doped (or n-doped in the case of the p-channel DMOS), in particular using diffusion or implantation. Afterward or beforehand, it is also possible to produce n-type wells for complementary field effect transistors.

The connection regions 30, 32 are then defined and lightly n-doped, for example using photolithography and diffusion or implantation. Photolithography is then used to define the source regions 22, 24, which are subsequently heavily n-doped, e.g. by means of diffusion or implantation. Finally, the connection regions 26, 28 for the body regions 18, 20 are defined photolithographically and subsequently heavily p-doped.

The epitaxial layer 14, the buried layer 70 and, if appropriate, also the buried layers are produced before the fabrication steps are carried out, for example, when BiCMOS fabrication (i.e. when both bipolar transistors and field effect transistors are fabricated) is carried out.

Essentially the same steps are performed when producing the transistor 110. However, the cutout for the drain region is first etched only to the same depth as the cutouts for the gate regions 136, 138, i.e. to a depth of less than half the trench depth of the trench 134. The thin gate oxide layer is then produced. Only afterward is the cutout for the drain region 140 lengthened beyond the trench bottom of the trench 134 right into the buried layer 170 or right into the n-type well 116.

Similar method steps are likewise carried out when producing the transistor 210. However, a trench etching for deep insulating trenches is carried out after the etching of the shallow insulating trenches 248, 250 and of the shallow part of the trench 234. The deep trench regions 302 and 304 of the trench 234 are produced in the process. Moreover, it is possible to produce deep insulating trenches at other locations of the integrated circuit, for example in memory cell arrays for so-called trench capacitors.

In another embodiment, instead of an n-channel DMOS transistor, p-channel DMOS transistors are produced using the same fabrication techniques but opposite dopings.

In accordance with the embodiments explained, each trench has a trench edge surrounding the trench. The trench edge is a closed line running around the trench at that surface of the epitaxial layer 14 or of the substrate 12 at which the source connection region arranged outside the trench is also situated.

Accordingly, in various embodiments of the field effect transistor, insulating material is arranged between the trench bottom below the control region and the control region. The boundary between the control region and the insulating material lies in the upper half of the trench part containing the control region or in the upper third of the trench part containing the control region. In one refinement, the boundary between the two regions lies parallel to the deep trench bottom. The region with the insulating material serves for setting the length of the drift path. Thus, the control region extends, for example, only down to a depth of 500 nm. The deepest locations in the trench, which are filled with insulating material, also extend, however, to a depth of, for example, greater than 1 µm or even to a depth of up to 8 µm. The long insulating regions result in a high dielectric strength without additional chip area being used. However, the insulating region can also be filled with electrically conductive material that is electrically insulated on all sides.

The trench may extend deeper below the control region than below the inner connection region. For example, the trench may be more than twice as deep or more than three times as deep below the control region compared with below the inner connection region. By virtue of this measure, the drift zone lies on both sides of the deep insulating material, with the result that the length of the drift zone is approximately doubled for the same trench depth.

Alternatively, the trench may be deeper below the inner connection region than below the control region. This is the case when the trench is a shallow trench, i.e. a trench having a depth of less than 1 µm, in particular having a depth of less than 500 nm. In this case, the inner connection region penetrates through the trench bottom of the shallow trench to reliably make contact with the drift region.

The control region is doped in accordance with the first doping type, e.g. n-doped. The connection regions may likewise be doped with the first doping type. The connection regions may be very highly doped, for example with $10^{19}$ or $10^{20}$ doping atoms per cubic centimeter.

The region for the formation of the inversion channel may be p-doped in accordance with the above. The drift zone may be doped in accordance with the first doping type, e.g. n-doped. The doping of the drift zone is comparatively low in order that large voltage drops are generated. By way of example, the doping of the doping zone may be $10^{15}$ doping atoms per cubic centimeter.

Also, the inner connection region may be doped more heavily than the drift zone. The outer connection regions, the drift region and the region for the connection of the inversion channel may be arranged in monocrystalline semiconductor material such as silicon.

The field effect transistor may be integrated in an integrated circuit in which further components are situated. These components are interconnected by interconnects, for example components of a control circuit for driving the field effect transistor. However, the field effect transistor can also be constructed as a separate component.

The field effect transistor also may contain a layer which is heavily doped in comparison with the drift zone. This layer insulates the field effect transistor from a substrate which is doped in accordance with a different doping type than the heavily doped layer. This is used both in circuits with bipolar transistors and field effect transistors, e.g. in BiCMOS circuits, and when the field effect transistor is produced in an integrated circuit in which only field effect transistors and, apart from parasitic transistors, no bipolar transistors are situated.

The trench may extend right into the heavily doped layer, so that the heavily doped layer is also utilized as a connection zone for the drift zone. Alternatively, the trench may be arranged at a distance from the heavily doped layer. By virtue of this, a region between the trench and the heavily doped layer can also be utilized as a drift path.

The trench may have two trench ends, a further control region being arranged in the trench. In this case, the trench runs in rectilinear fashion. This is suitable especially for specific metallizations which, on account of electromigration processes, can only carry specific current densities. Alternatively, the trench forms a ring, with a ring-shaped control region surrounding the inner connection region. By virtue of the ring-shaped trench, it is possible to produce field effect transistors on a small chip area.

The field effect transistor thus has a low on resistivity $R_{ON}$ and a high saturation current $I_{SAT}$. Moreover, the arrangement of the control region and connection region in one trench decreases the fabrication steps and increases the degrees of freedom for realization of different electronic properties of the field effect transistor.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. A method for fabricating a double diffused metal oxide semiconductor field effect transistor, the method comprising the following implemented without any restriction by the order specified:

forming a trench in a drift region of a substrate, the trench having a sidewall and a base, at least the sidewall adjoining the drift region;

filling the trench with an insulating material;

patterning the insulating material to produce a first cutout for a control region, and a second cutout for a drain region, the first and second cutouts isolated by the insulating material, the drain region being connected to the drift region;

providing an electrically conductive material in the first and second cutouts;

forming a source region outside the trench before or after forming the trench, and an inversion channel region before or after forming the trench, the inversion channel adjoining the drift region and the source region, wherein the inversion channel and the drift region are separate components;

wherein the first trench is deeper below the control region than below the drain region;

insulating material is disposed between a bottom of the first trench below the control region and the control region;

deepening the trench in at least one partial region and maintaining the trench depth in at least one other partial region, wherein trench regions with mutually different trench depths arise; and a deepest boundary between the control region and the insulating material is disposed in an upper half of the first trench containing the control region.

2. The method as claimed in claim 1, wherein:

the deepest boundary is parallel to the trench bottom thereneath.

3. The method as claimed in claim 1, further comprising insulating the field effect transistor from the substrate using an insulating layer, the substrate being doped with a different doping type than the insulating layer, the insulating layer more heavily doped than the drift region, wherein at least one of the trench or the drain region extends into the insulating layer.

4. The method as claimed in claim 1, further comprising insulating the field effect transistor from the substrate using an insulating layer, the substrate being doped with a different doping type than the insulating layer, the insulating layer more heavily doped than the drift region, wherein neither the trench nor the drain region extends into the insulating layer.

5. A method for fabricating a diffusion metal oxide semiconductor field effect transistor, the method comprising the following implemented without any restriction by the order specified:

forming a trench in a drift region of a substrate, the trench having a sidewall and a base, at least the sidewall adjoining the drift region;

filling the trench with an insulating material;

patterning the insulating material to produce a first cutout for a first control region and a second cutout for a drain region, the first and second cutouts isolated by the insulating material, the drain region being connected to the drift region;

providing an electrically conductive material in the first and second cutouts;

forming a source connection region outside the trench before or after forming the trench, and an inversion channel region before or after forming the trench, the inversion channel adjoining the drift region and the source region, wherein the inversion channel and the drift region are separate components; and at least one of:

forming a second control region in the trench, or forming the trench in a ring, the first control region being ring-shaped and surrounding the drain region;

wherein the first trench is deeper below the control region than below the drain region;

insulating material is disposed between a bottom of the first trench below the control region and the control region;

deepening the trench in at least one partial region and maintaining the trench depth in at least one other partial region, wherein trench regions with mutually different trench depths arise; and a deepest boundary between the control region and the insulating material is disposed in an upper half of the first trench containing the control region.

6. The method as claimed in claim 5, wherein:

the deepest boundary is parallel to the trench bottom thereneath.

7. The method as claimed in claim 5, further comprising insulating the field effect transistor from the substrate using an insulating layer, the substrate being doped with a different doping type than the insulating layer, the insulating layer more heavily doped than the drift region, wherein at least one of the trench or the drain region extends into the insulating layer.

8. The method as claimed in claim 5, further comprising insulating the field effect transistor from the substrate using an insulating layer, the substrate being doped with a different doping type than the insulating layer, the insulating layer more heavily doped than the drift region, wherein neither the trench nor the drain region extends into the insulating layer.

* * * * *